US007831765B2

(12) United States Patent
Regev et al.

(10) Patent No.: US 7,831,765 B2
(45) Date of Patent: *Nov. 9, 2010

(54) DISTRIBUTED PROGRAMMABLE PRIORITY ENCODER CAPABLE OF FINDING THE LONGEST MATCH IN A SINGLE OPERATION

(75) Inventors: Alon Regev, Woodland Hills, CA (US); Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/484,854

(22) Filed: Jul. 12, 2006

(65) Prior Publication Data

US 2007/0022246 A1    Jan. 25, 2007

Related U.S. Application Data

(63) Continuation of application No. 10/330,243, filed on Dec. 30, 2002, now Pat. No. 7,099,992.

(51) Int. Cl.
*G06F 12/00* (2006.01)

(52) U.S. Cl. ...................... 711/108; 365/49.1

(58) Field of Classification Search ............... 711/108; 365/49
See application file for complete search history.

(56) References Cited

U.S. PATENT DOCUMENTS

| 5,555,397 | A  | 9/1996  | Sasama et al. |
| 6,542,391 | B2 | 4/2003  | Pereira et al. |
| 6,910,097 | B1 | 6/2005  | Srinivasan et al. |
| 2002/0161969 | A1 | 10/2002 | Nataraj et al. |
| 2003/0005146 | A1 | 1/2003  | Miller et al. |
| 2003/0188090 | A1 | 10/2003 | Darnell et al. |
| 2004/0022082 | A1 | 2/2004  | Khanna |
| 2004/0030803 | A1 | 2/2004  | Eatherton et al. |

*Primary Examiner*—Kevin L Ellis
*Assistant Examiner*—Matthew Bradley
(74) *Attorney, Agent, or Firm*—Dickstein Shapiro LLP

(57) ABSTRACT

A distributed, hierarchically-structured, programmable priority encoder for a content addressable memory (CAM) device including at least one section, the section further including a section level priority encoder, and a plurality of blocks, each block further including a block level priority encoder, and a plurality of slices. The distributed, hierarchically-structured, programmable priority encoder, wherein each slice further including a CAM slice, a maskable comparand register coupled to the CAM slice and a programmable priority encoder coupled to said CAM slice and further coupled to said block level priority encoder.

16 Claims, 9 Drawing Sheets

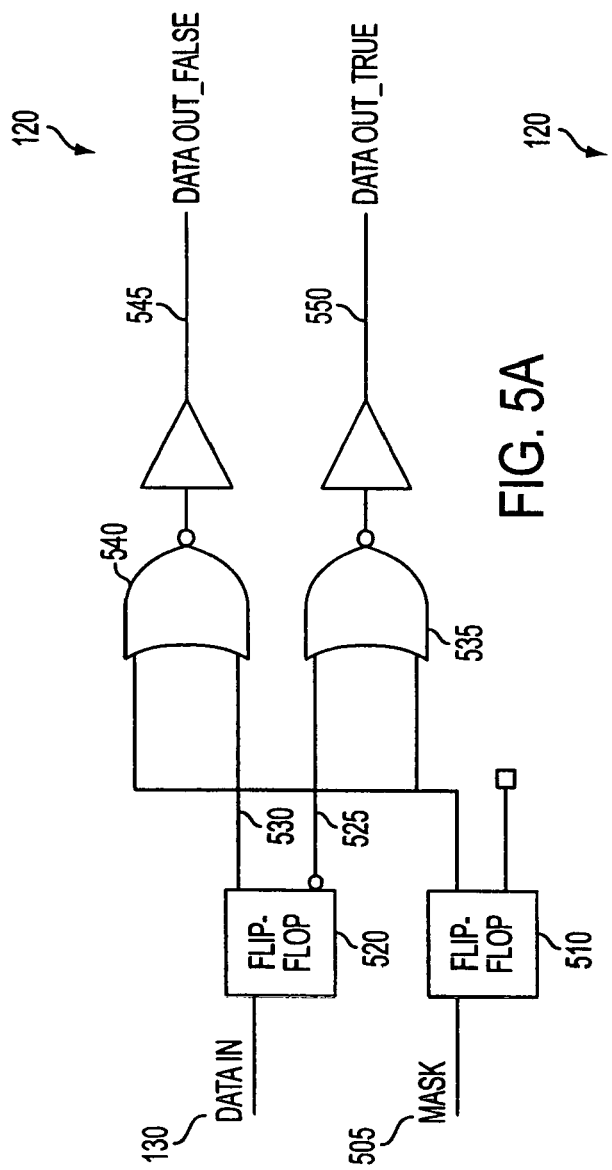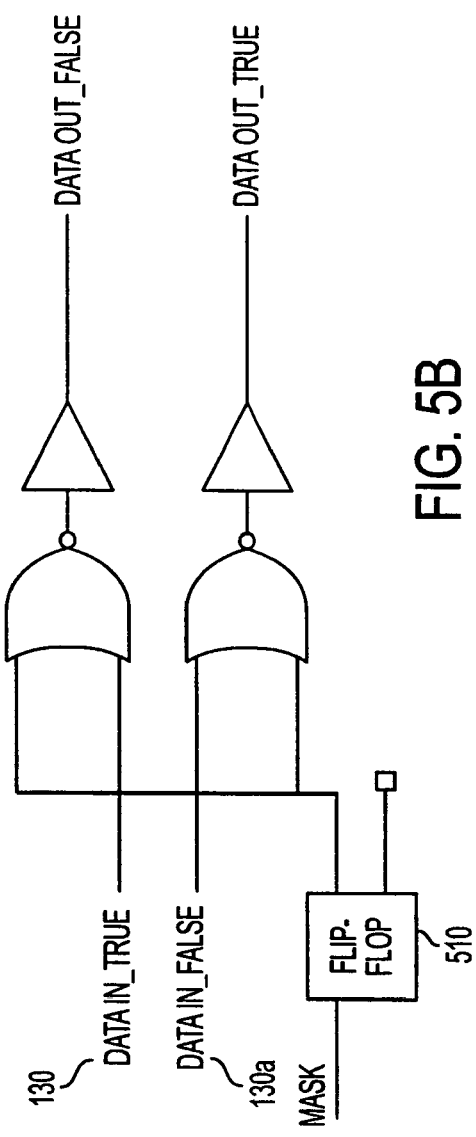

DISTRIBUTED PROGRAMMABLE PRIORITY ENCODER CAPABLE OF FINDING THE LONGEST MATCH IN A SINGLE OPERATION

CROSS-REFERENCE TO RELATED APPLICATIONS

The present application is a continuation application of U.S. patent application Ser. No. 10/330,243, now U.S. Pat. No. 7,099,992 filed on Dec. 30, 2002, the disclosure of which is incorporated herein by reference in its entirety.

This invention is related to U.S. patent application entitled "Content Addressable Memory (CAM) Device Employing a Recirculating Shift Register for Data Storage" Ser. No. 11/493,842 filed concurrently herewith.

FIELD OF THE INVENTION

The present invention relates generally to a content addressable memory (CAM) device and, in particular, to a programmable priority encoder of a CAM.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A conventional CAM is viewed as a static storage device constructed of modified RAM cells. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers, gateways and switches, computer systems and other devices that require rapid content searching, such as routing data or tables for data networks or matching URLs. Some of these tables are "learned" from the data passing through the network. Other tables, however, are fixed tables that are loaded into the CAM by a system controller. These fixed tables reside in the CAM for a relatively long period of time. A word in a CAM is typically large and can be 96 bits or more.

In order to perform a memory search in the above-identified manner, CAMs are organized differently than other memory devices (e.g., DRAM and SRAM). For example, data is stored in a RAM in a particular location, called an address. During a memory access, the user supplies an address and reads into or gets back the data at the specified address. In a CAM, however, data is stored in locations in a somewhat random fashion. The memory storage locations can be selected by an address bus, or the data can be written into the first empty memory storage location. Every memory storage location has a pair of status bits that keep track of whether the memory storage location is storing valid information or is empty and available for writing.

Once information is stored in a memory storage location, it is found by comparing every bit stored in memory storage location with data in the comparand register. When the contents stored in the CAM memory storage location do not match the data in the comparand register, the local match detection circuit returns a no match indication. When the contents stored in the CAM memory storage location match the data in the comparand register, the local match detection circuit returns a match indication. If one or more local match detect circuits return a match indication, the CAM device returns a "match" indication. Otherwise, the CAM device returns a "no-match" indication. In addition, the CAM may return the identification of the address/memory storage location in which the desired data is stored or one of such addresses, such as a highest priority match address, if more than one address contained matching data. Thus, with a CAM, the user supplies the data and gets back the address if there is a match found in memory.

Sometimes it is desirable to find a closest match if there are no exact matches between the words stored in the CAM array and the comparand word stored in the comparand register. In prior art CAMs, the search for the closest match, also referred to as the longest match in that a largest number of bits in a memory storage location match bits in the comparand word, is performed in one of two ways. In the first method, using binary CAMs, if a match is not found on the full comparand, then certain bits in the comparand are masked and the search operation is repeated in an attempt to find a match on less than all bits. If one bit of the comparand is masked at a time, then finding the closest possible match may require many repeated operations/searches.

In a second method, using ternary CAMs, data (e.g., such as routing data which may consist of, for example network addresses and/or URLs) in the CAM is not random but rather is stored in an ordered fashion. Data (a pattern) with the most complete information on the path to the destination are stored in locations with the highest priority. Routing data pertaining to a less important part of the path to the destination are stored in locations with a lower priority and bits in such words, that would otherwise carry information about the remainder of the routing path, are masked or set to the "don't care" state.

Using the second method would result in the longest match being located in a single operation because the word containing the larger number of bits that match bits in the comparand register has a higher priority and will, thus, be pointed to first. The second method has two major disadvantages, however. The second method requires the use of a ternary CAM. In a ternary CAM there are two bits in the CAM for each data bit, which almost doubles the size of the CAM. Secondly, multiple copies of the same data are stored in multiple locations with different levels of priority and more bits are masked in every copy of lower priority locations. Thus, it is desirable to have a CAM priority encoder capable of identifying the closest match to the comparand word without requiring extensive search durations and without requiring increased CAM sizes.

SUMMARY OF THE INVENTION

The present invention addresses the above-identified shortcomings by dividing the priority encoder of a CAM into sections, blocks, and slices, where each slice has an integral priority encoder to discern the priority within the slice. The hierarchical structure of the priority encoder of the present invention allows data to be stored randomly in the hierarchical units (sections, blocks and slices) of a CAM and to associate priority levels with non-contiguous components of the hierarchical units. It is, thus, possible to locate a closest match in a single operation.

Further, since, in certain applications, a perfect match between the data being searched and the data stored in the CAM is not attainable, finding the "longest match" may be sufficient. The present invention also describes a method and a circuit to find the longest matching word in a CAM having a programmable priority encoder of the present invention.

BRIEF DESCRIPTION OF THE DRAWINGS

FIG. 5a is an exemplary embodiment of a bit of a maskable comparand register of the present invention;

FIG. 5b is an alternative embodiment of a bit of a maskable comparand register of the present invention;

DETAILED DESCRIPTION OF THE INVENTION

A priority encoder of a CAM is used to output the highest priority match address. The structure and operational details of an exemplary priority encoder are described in U.S. patent application Ser. No. 10/188,971, entitled "NOVEL PRIORITY ENCODER" filed Jul. 5, 2002 by Zvi Regev, which is incorporated in its entirety herein by reference.

Figure 1:
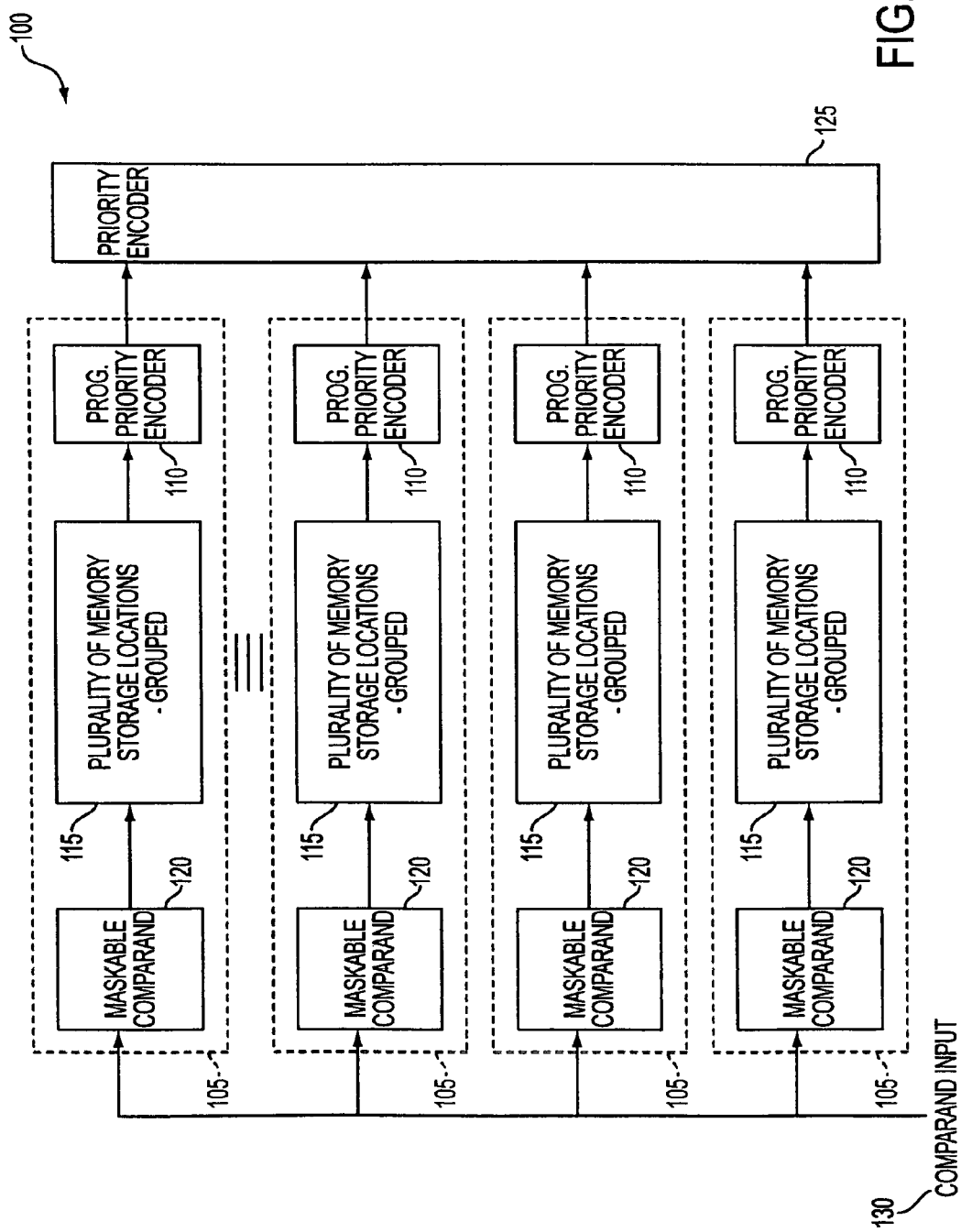
FIG. 1 is a block diagram of a CAM of the present invention divided into slices.

A CAM including a priority encoder of the present invention is divided into sections, blocks, and slices, where each CAM slice has an integral priority encoder to discern the priority within the slice. FIG. 1 is a block diagram of a CAM 100 of the present invention divided into slices. Each box outlined in dotted lines is an exemplary CAM slice 105 of CAM 100 of the present invention. Each CAM slice 105 includes a maskable comparand register 120, a distributed, programmable priority encoder 110 and a plurality of memory storage locations grouped together 115.

The plurality of memory storage locations grouped together 115 form a slice of memory storage locations. In addition to the distributed, programmable priority encoder 110 integral to each slice, which determines the highest priority match address from among the plurality of memory storage locations grouped together 115, there is a priority encoder 125, which receives input from each of the distributed, programmable priority encoders 110 integral to each slice of memory storage locations.

The priority encoder 125 then determines the highest priority match address from among the highest priority match addresses input to it by each of the distributed, programmable priority encoders 110. Each of the maskable comparand registers 120 receives comparand input 130. Each CAM slice 105 is assigned to an identity (number), which depends on the physical location of that CAM slice 105 within the CAM and in the priority hierarchy. An added benefit of such an arrangement is that it may be programmed.

Figure 2:
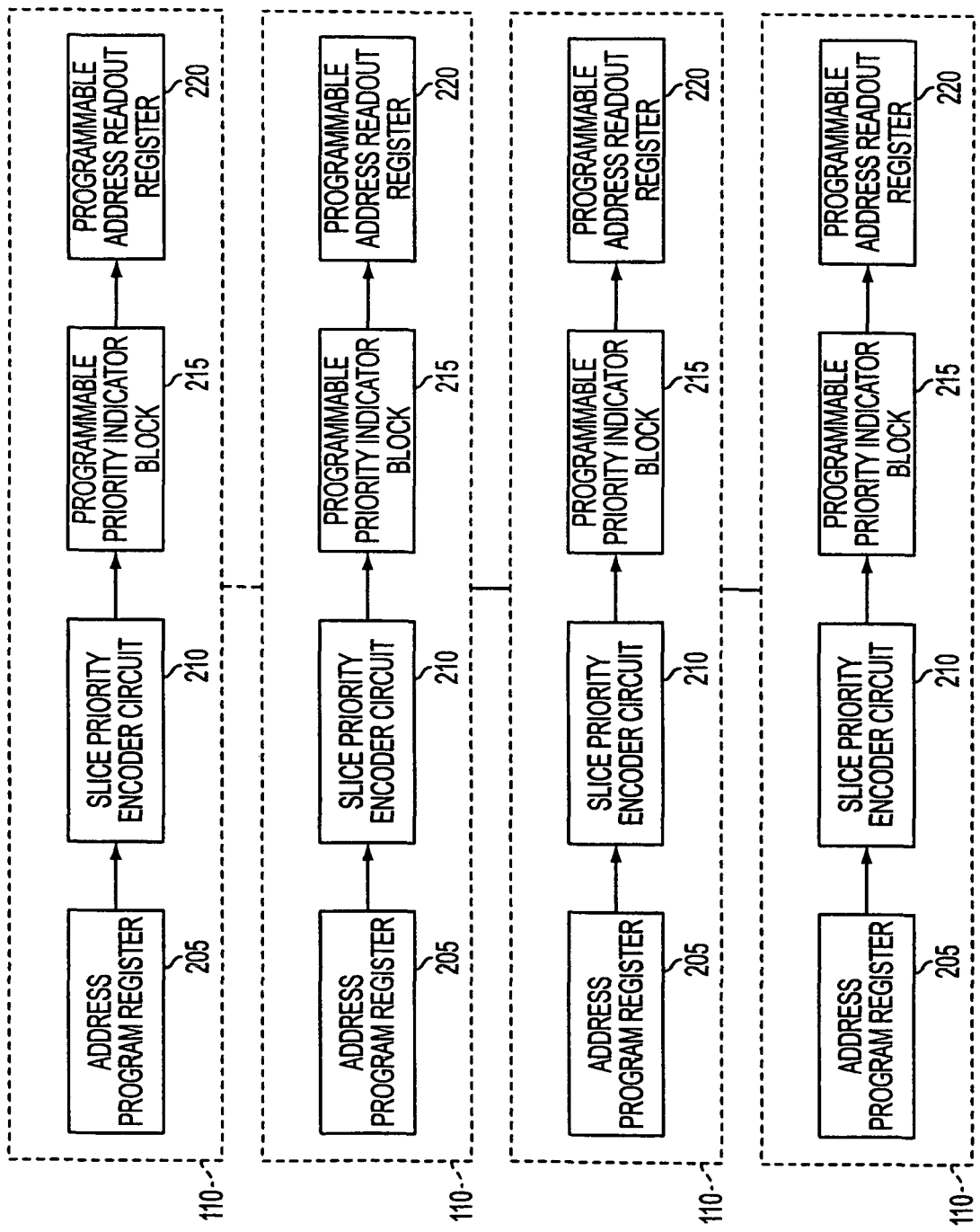
FIG. 2 is a block diagram of a distributed, programmable priority encoder of the present invention.

FIG. 2 is a block diagram of a distributed, programmable priority encoder 110 of the present invention depicted in FIG. 1. Each of the distributed, programmable priority encoders 110 includes an address program register 205, a slice priority encoder circuit 210, a programmable priority indicator block 215 and a programmable address readout register 220. Each distributed, programmable priority encoder 110 is coupled to a slice of memory storage locations 115. The address program register 205 of a distributed, programmable priority encoder 110 is coupled, therefore, to the plurality of memory storage locations 115 that form a particular CAM slice 105. The address program register 205 is coupled to a slice priority encoder circuit 210, which is coupled to a programmable priority indicator block 215. The programmable priority indicator block is coupled to a programmable address readout register 220.

Figure 3A:
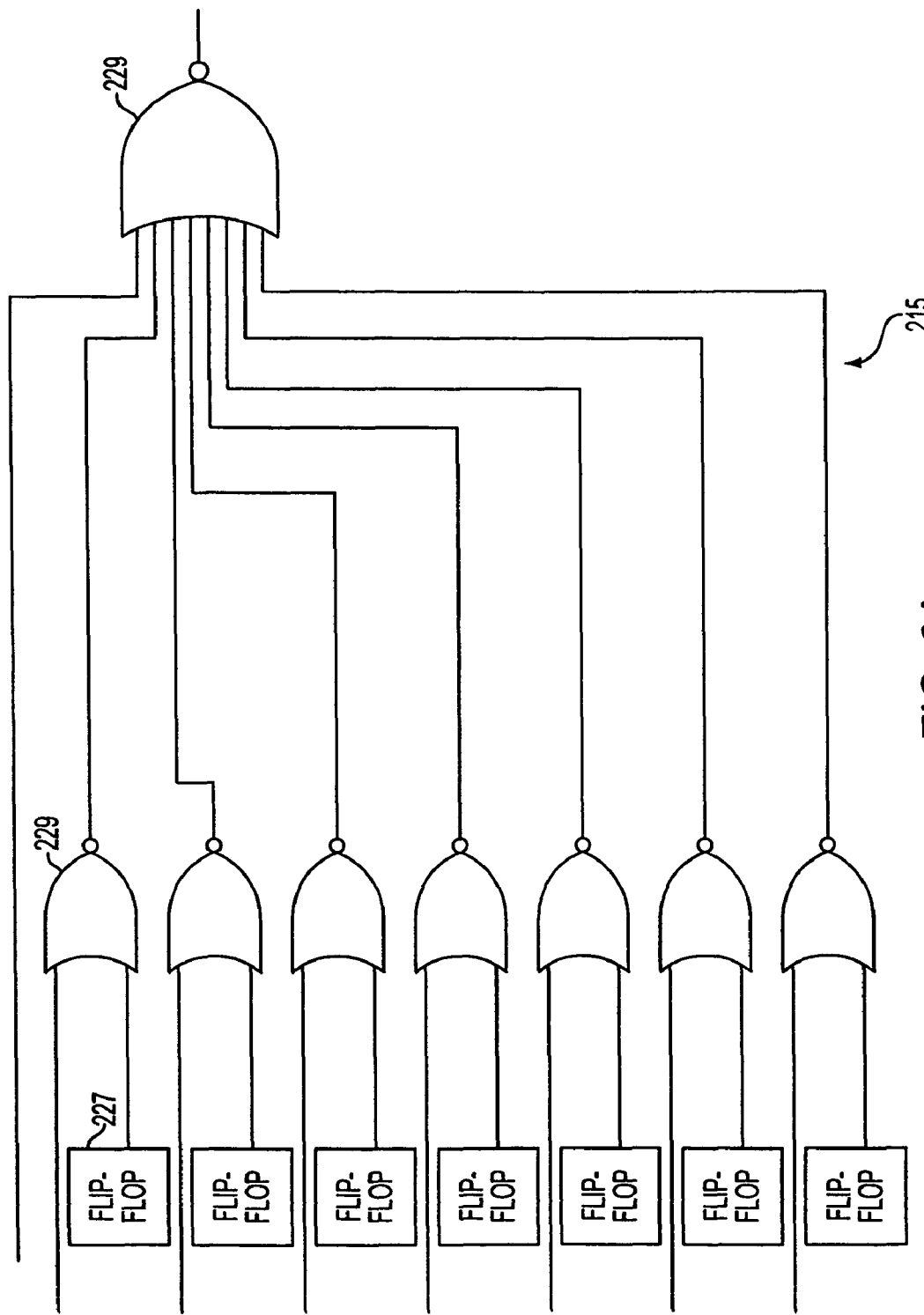
FIG. 3a is an exemplary embodiment of a programmable priority indicator block of a distributed, programmable priority encoder of the present invention.

FIG. 3a is an exemplary embodiment of a programmable priority indicator block 215 of a distributed, programmable priority encoder 110 of the present invention. In this embodiment, a slice priority encoder circuit 210 provides input to the programmable priority indicator block 215. The programmable priority indicator block includes a plurality of flip-flops 227 and NOR gates 229.

Figure 3B:
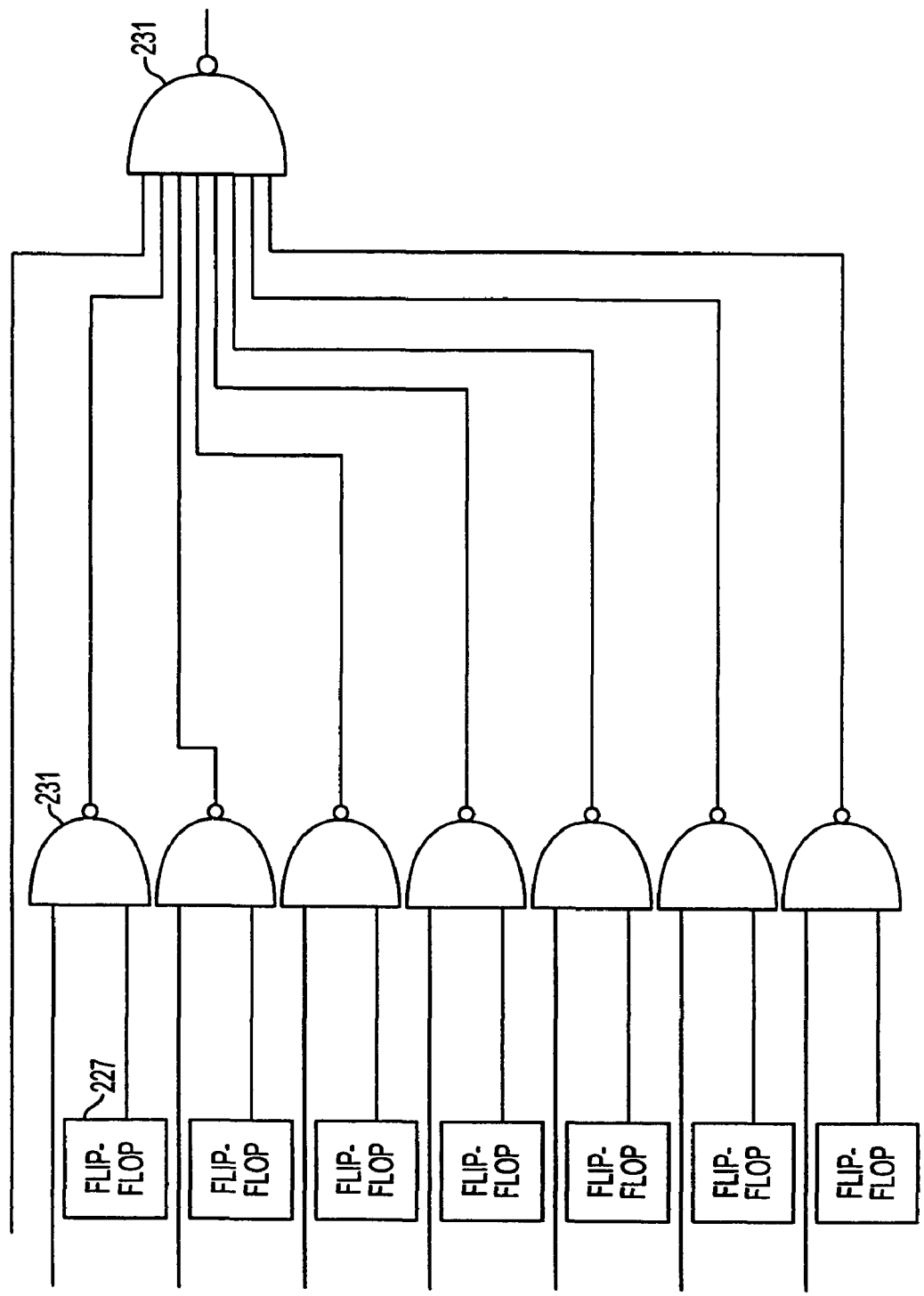
FIG. 3b is an alternative exemplary embodiment of a programmable priority indicator block of a distributed, programmable priority encoder of the present invention.

Unlike a conventional priority indicator block, where the gate structure is different on every input, in the programmable priority indicator block of the present invention, all logic blocks (flip-flop and NOR gate pair) are identical and all inputs are shared with all the logic blocks. This configuration allows programming of the priority level of each memory storage location regardless of the physical location of the memory storage location in the CAM or in the priority encoder. FIG. 3b is an alternative exemplary embodiment of a programmable priority indicator block of a distributed, programmable priority encoder of the present invention. In this embodiment, a plurality of NAND gates 231 replace the NOR gates depicted in FIG. 3a.

Figure 4:
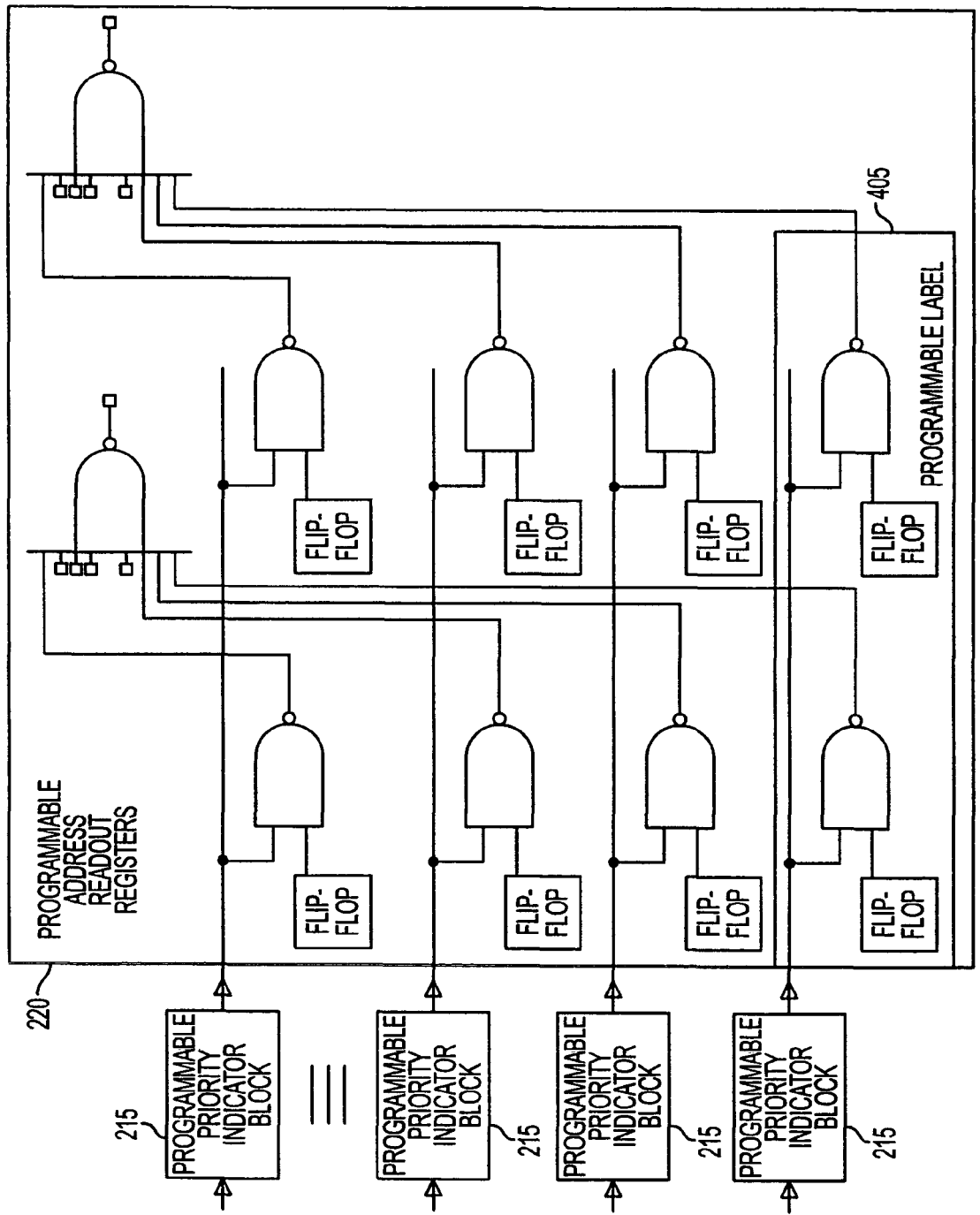
FIG. 4 is an exemplary block diagram of programmable address readout registers of a distributed, programmable priority encoder and the programmable priority indicator blocks of the present invention.

FIG. 4 is an exemplary block diagram of programmable address readout registers 220 of a distributed, programmable priority encoder 110 and the programmable priority indicator blocks 225 of the present invention. FIG. 4 depicts programmable priority indicator blocks 215 coupled to a plurality of programmable address readout registers 220. The programmable address readout registers include programmable labels 405. Programmable labels in conjunction with the programmable address readout registers facilitate the programmability of CAM slice 110, specifically enabling the priority encoder to program/set the identity of each memory storage location.

The principal purpose of a priority encoder is not to assign priority to data/patterns in the CAM but rather to be used as a tool to convert a physical location (memory storage location) having data that matches data in a comparand register, to a address identifying this location. Changing the order of inputs (e.g., memory storage locations) to the priority encoder is, therefore, of no consequence as long as the true identity of every input to the priority encoder can be maintained.

Both the priority level of each memory storage location and the identity assigned to that memory storage location are programmable. The priority level of each memory storage location is set by programming the priority level in the programmable priority indicator block 215. The identity of each memory storage location is set by programming the identity in the programmable address readout registers 220. Setting the flip-flops used to program both the programmable priority indicator block and the programmable address readout registers is not the subject of this invention and it may be performed in any of a number and variety of methods known to those skilled in the art. Such methods may include, but are not limited to, scan chains or implementation of these flip-flops inside a random access memory.

FIG. 5a is an exemplary embodiment of a bit of a maskable comparand register 120 of the present invention. The mask 505 for a particular bit is held in a memory storage location flip-flop 510. Data to change the mask is input as DATA IN 130 to flip-flop 520. One output 525 of flip-flop 520 is negated while the other output 530 of flip-flop 520 is output as it was input. The output of flip-flop 510 with the current mask is input to each of two NOR gates 535 and 540 The negated output 525 of flip-flop 520 is input to NOR gate 535 and output 530 is input to NOR gate 540. Outputs of the bit of the maskable comparand register 120 include both DATA OUT_FALSE 545 and DATA OUT_TRUE 550. Outputs 545 and 550 are input to bits of memory storage locations.

FIG. 5b is an alternative embodiment of a bit of a maskable comparand register 120 of the present invention. In this embodiment, the logic is reduced by one flip-flop and there are separate lines for DATA IN_TRUE and DATA IN_FALSE.

Employing the embodiments for the bits of a maskable comparand register 120 depicted in FIGS. 5a and 5b, instead of having a maskable comparand register for each memory storage location as in a conventional CAM, only a single maskable comparand register is used, which provides the mask to all memory storage locations in the CAM slice 105. Each slice includes a comparand masking register 120, which does not store the comparand, but only stores the mask associated with the particular CAM slice 105.

Each CAM slice encodes part of the CAM device. All the CAM slices 105 are coupled together to form the complete CAM. A CAM block, which is one level up in the hierarchy from a CAM slice, has its own priority encoder to discern priority between the CAM slices 105 within the CAM block. A plurality of hierarchical levels, each with its own priority encoder, provide for a large CAM structure.

Using programmable priority encoders, a plurality of CAM slices can be combined into a CAM block. The size of each CAM block is programmable and alterable. If, for instance, the smallest CAM slice is of 32 memory storage locations, then a CAM block size can be any integral number of CAM slices, and the plurality of CAM slices which comprise one CAM block are not required to be contiguous to each other. The size of a CAM slice is not limited to 32 memory storage locations. A CAM slice can have one memory storage location, eight memory storage locations, or any other number. Each CAM slice may be formed by a different number of memory storage locations.

Figure 6:
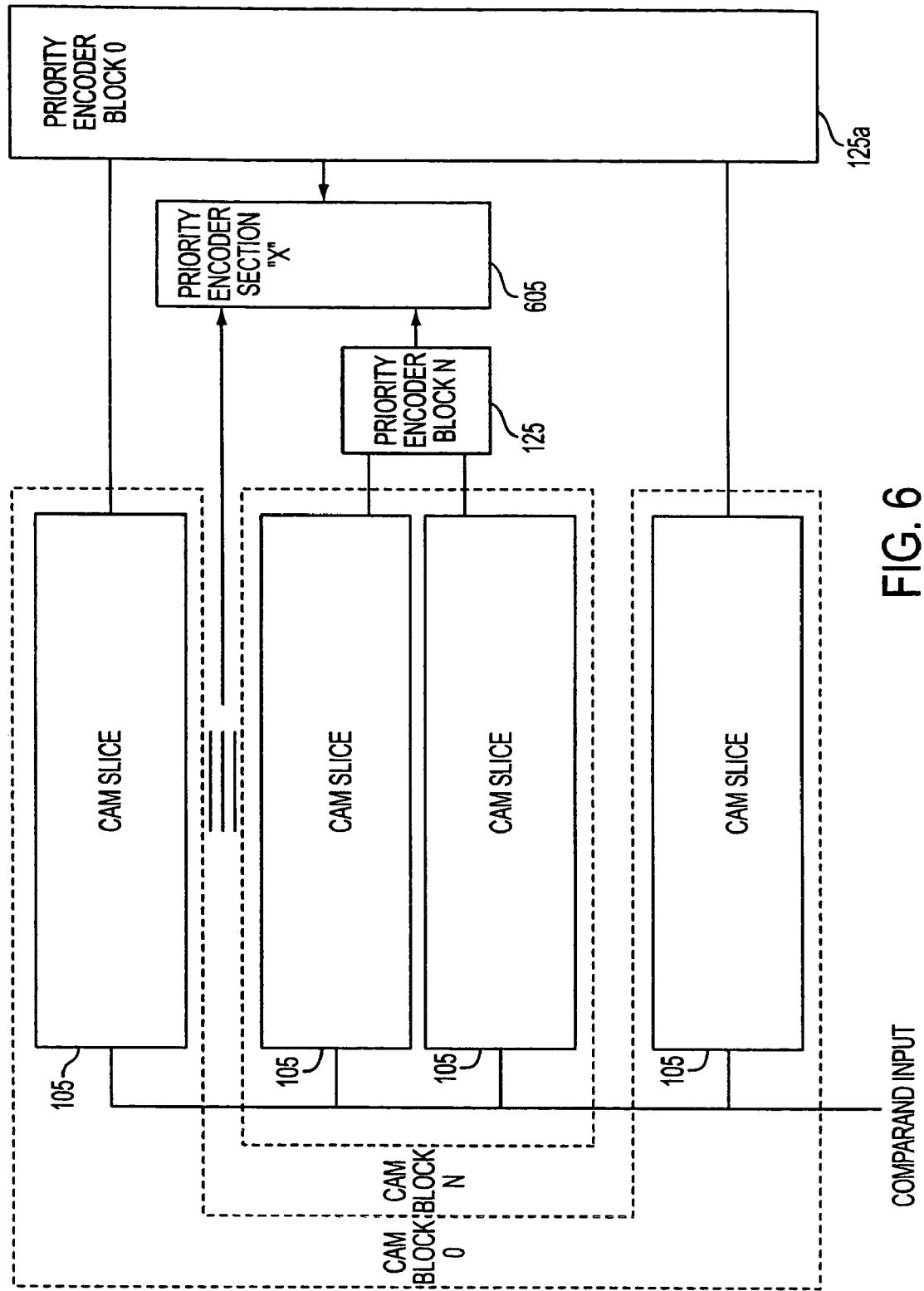
FIG. 6 is an exemplary embodiment of a CAM of the present invention divided into CAM blocks, each CAM block comprising a plurality of CAM slices.

FIG. 6 shows the CAM divided into CAM blocks, with a plurality of possibly non-contiguous CAM slices forming a CAM block. CAM block N is formed of a plurality of contiguous CAM slices 105. CAM block "0" is formed of a plurality of non-contiguous CAM slices 105. Priority encoder block N 125 receives input from the slices that comprise CAM block N and determines a highest priority match address from the inputs provided. Likewise, priority encoder block "0" 125a receives input from the slices that comprise CAM block "0" and determines a highest priority match address from the inputs provided. As a further example, Priority encoder section "x" 605 receives inputs from the blocks that form the section and determines a highest priority address from among the inputs provided.

The programmable priority encoders of each CAM slice 105 in a CAM block, are programmed such that the priority, between all the CAM slices which comprise a CAM block, ascend (or descend) throughout the entire CAM block. In the programmable priority encoder of the present invention, each entry (e.g., memory storage location, CAM slice, CAM block, or CAM section), or group of entries (e.g., CAM slice, CAM block or CAM section), may be assigned any priority level, regardless of the physical location of that entry, and wherein entries with ascending or descending priorities do not have to be contiguous.

The significance of the distributed, hierarchically-structured CAM and the distributed, hierarchically-structured, programmable priority encoder of the present invention is in the fact that the present invention provides for labeling and identification of any memory storage location in the CAM with any desired label, independent of the physical location in which the labeled pattern/data is stored in the CAM. The distributed, hierarchically-structured, programmable priority encoder of the present invention facilitates dividing the CAM into tables of any desired size and facilitates the association of patterns with tables regardless of the location of patterns in the CAM.

A CAM section is the next hierarchical level above the CAM block and is formed by combining a plurality of CAM blocks. Since there is at least one CAM section for the CAM device of the present invention, each CAM section also includes a section level priority encoder to determine a highest priority address from among the addresses supplied to it by the plurality of CAM blocks in the CAM section. It is further noted that CAM blocks of a CAM section may be non-contiguous.

Turning to an exemplary CAM application in which the CAM of the present invention used in a router, routing data is stored in CAM blocks in the CAM, in the order of their completeness. The most complete routing data is stored in a CAM block with the highest level assigned (programmed) priority, while less complete data is stored in a CAM block of a lesser priority, such that all the words within a CAM block can always be changed by the addition, or subtraction of CAM slices.

The comparand registers are programmed such that as the completeness of the routing data in the CAM slice is lessened, more bits in the comparand register are masked, and therefore not involved in the matching process. However, all the comparand registers within a CAM block have exactly the same bits masked.

The same comparand data is loaded to all the comparand registers throughout the CAM. In the highest priority CAM block, all the bits are to be matched, while in the next, lower priority, CAM block, one bit is masked. If all but the masked bits are matching, it is concluded that a match exists on that priority level. The same process is performed simultaneously on all of the CAM blocks in the CAM. As the more complete routing data is stored with a higher priority, the most complete data, or the longest match, will always be pointed out during a memory search operation. If the space allocated for specific routing data completeness is used up, the user need not rewrite the entire CAM to make room in any used up table. That is, if space is allocated for a table of routing data, that is at a particular priority level, to be stored in a CAM slice or CAM block, then some of the CAM slices or CAM blocks must be re-allocated in order to accommodate data of the same priority level. This may include re-writing a portion of the CAM to accommodate the re-allocation of table of data to CAM slices or CAM blocks.

Figure 7:
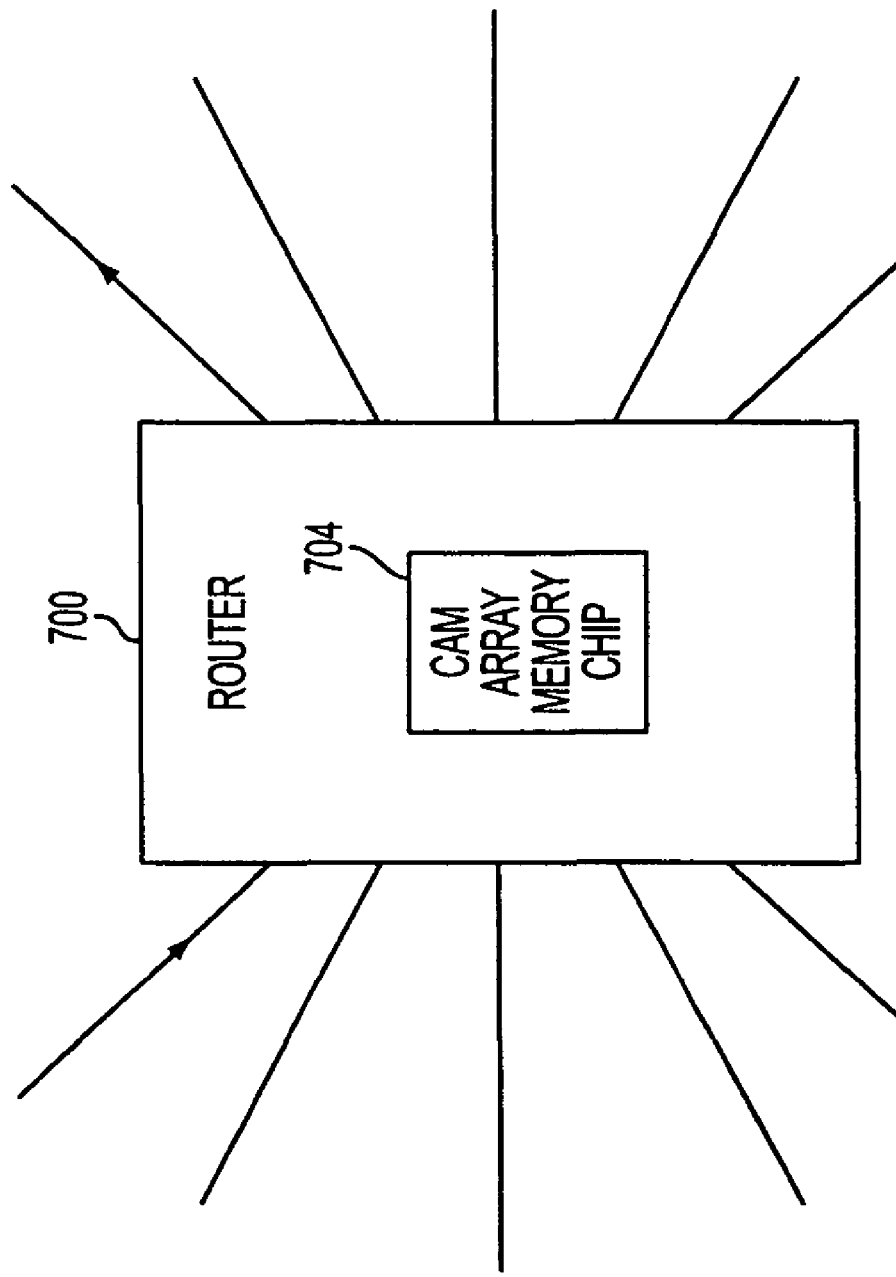
FIG. 7 is an exemplary embodiment of a router incorporating a CAM of the present invention.

FIG. 7 is a simplified block diagram of a router 700 connected to a CAM array memory chip 704 employing programmable priority encoders constructed as described above in connection with FIGS. 1-6. The router 700 contains a plurality of input lines and a plurality of output lines. When data is transmitted from one location to another, it is sent in a form known as a packet. Oftentimes, prior to the packet reaching its final destination, that packet is first received by a router, or some other device. The router 700 then decodes that part of the data identifying the ultimate destination and decides which output line and what forwarding instructions are required for the packet.

Figure 8:
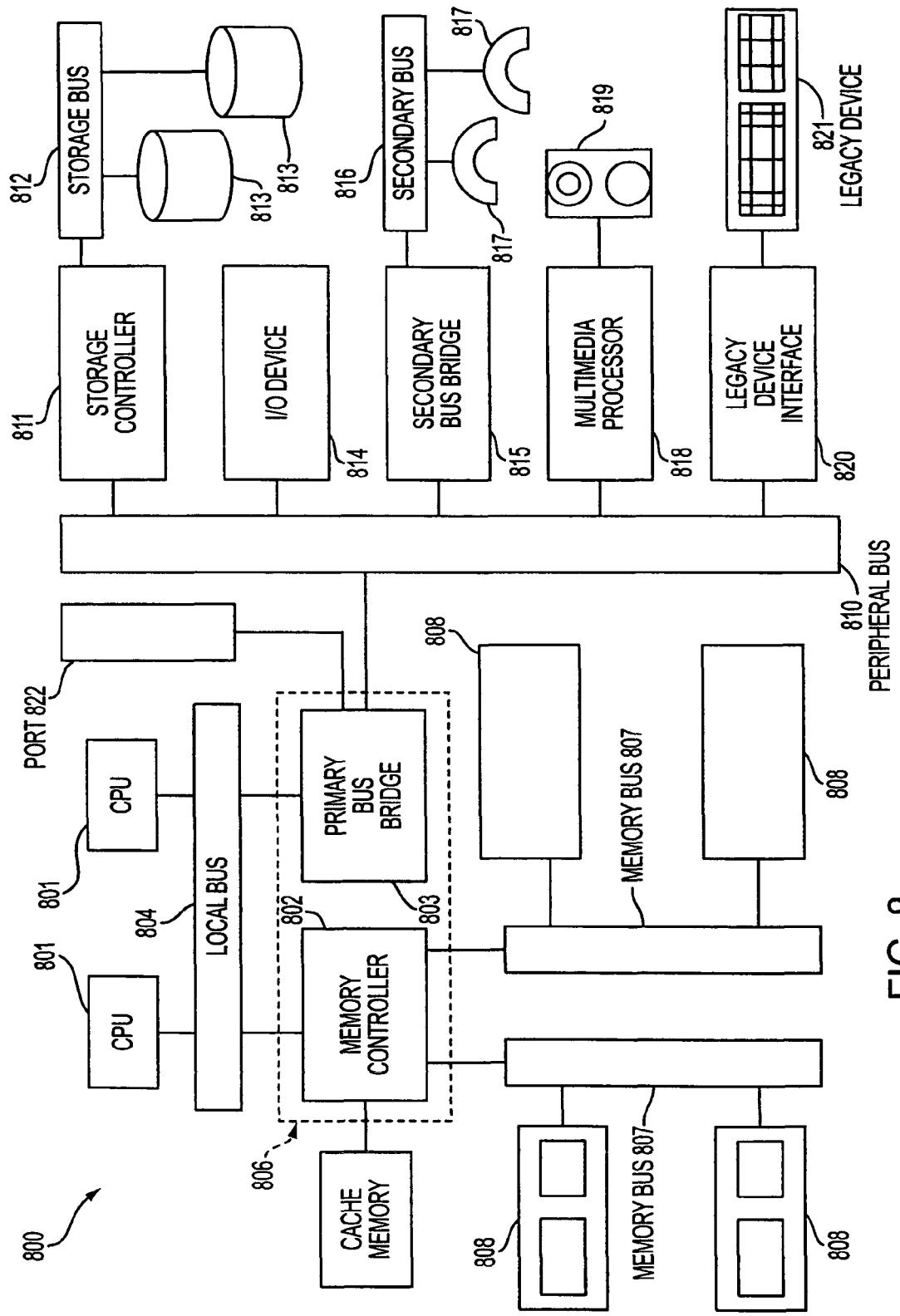
FIG. 8 is an exemplary processor system using a CAM of the present invention.

FIG. 8 illustrates an exemplary processing system 800 which may utilize a processor coupled to a CAM having a distributed programmable priority encoder constructed in accordance with any of the embodiments of the present invention disclosed above in connection with FIGS. 1-6. The processing system 800 includes one or more processors 801 coupled to a local bus 804. A memory controller 802 and a primary bus bridge 803 are also coupled to the local bus 804. The processing system 800 may include multiple memory controllers 802 and/or multiple primary bus bridges 803. The memory controller 802 and the primary bus bridge 803 may be integrated as a single device 806.

The memory controller 802 is also coupled to one or more memory buses 807. Each memory bus accepts memory components 808 which include at least one CAM device having a distributed programmable priority encoder of the present invention. The memory components 808 may be a memory card or a memory module. Examples of memory modules include single inline memory modules (SIMMs) and dual inline memory modules (DIMMs). The memory controller 802 may also be coupled to a cache memory 805. The cache memory 805 may be the only cache memory in the processing system. Alternatively, other devices, for example, processors 801 may also include cache memories, which may form a cache hierarchy with cache memory 805. If the processing system 800 includes peripherals or controllers which are bus masters or which support direct memory access (DMA), the memory controller 802 may implement a cache coherency protocol. If the memory controller 802 is coupled to a plurality of memory buses 807, each memory bus 807 may be operated in parallel, or different address ranges may be mapped to different memory buses 807.

The primary bus bridge 803 is coupled to at least one peripheral bus 810. Various devices, such as peripherals or additional bus bridges may be coupled to the peripheral bus 810. These devices may include a storage controller 811, an miscellaneous I/O device 814, a secondary bus bridge 815, a multimedia processor 818, and an legacy device interface 820. The primary bus bridge 803 may also coupled to one or more special purpose high speed ports 822. In a personal computer, for example, the special purpose port might be the Accelerated Graphics Port (AGP), used to couple a high performance video card to the processing system 800.

The storage controller 811 couples one or more storage devices 813, via a storage bus 812, to the peripheral bus 810. For example, the storage controller 811 may be a SCSI controller and storage devices 813 may be SCSI discs. The I/O device 814 may be any sort of peripheral. For example, the I/O device 814 may be an local area network interface, such as an Ethernet card. The secondary bus bridge may be used to interface additional devices via another bus to the processing system. For example, the secondary bus bridge 816 may be an universal serial port (USB) controller used to couple USB bus devices 817 via to the processing system 800. The multimedia processor 818 may be a sound card, a video capture card, or any other type of media interface, which may also be coupled to one additional devices such as speakers 819. The legacy device interface 820 is used to couple legacy devices, for example, older styled keyboards and mice, to the processing system 800.

The processing system 800 illustrated in FIG. 8 is only an exemplary processing system with which the invention may be used. While FIG. 8 illustrates a processing architecture especially suitable for a general purpose computer, such as a personal computer or a workstation, it should be recognized that well known modifications can be made to configure the processing system 800 to become more suitable for use in a variety of applications. In addition, for use in a router, a simpler processor architecture may be used to couple the CAM memory devices to a processor.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A system comprising:
    a content addressable memory (CAM) device coupled with a processor, the CAM comprising:
    a CAM block having a plurality of CAM slices, wherein each of the plurality of CAM slices comprises:
        a plurality of memory storage locations for storing data to be matched with a search word, and
        an integral priority encoder for determining a highest priority match address for those storage locations of a CAM slice which match a search word, wherein the integral priority encoder is a programmable priority encoder coupled to the plurality of memory storage locations and consists of:
        an address program register;
        a slice priority encoder circuit coupled to the address program register; and
        a programmable priority indicator block coupled to the slice priority encoder circuit, wherein the address program register, the slice priority encoder circuit, and the programmable priority indicator block are encompassed within the same CAM slice and the programmable priority indicator block is used to set a priority level for each memory storage location in the plurality of memory storage locations within the CAM slice; and
    a block level priority encoder for receiving input from each of the integral priority encoders of the plurality of CAM slices for determining a highest priority match address for the storage locations within the CAM block.

2. The system according to claim 1, wherein the programmable priority encoder further comprises:
    a programmable address readout register coupled to the programmable priority indicator block, wherein the programmable address readout registers are used to set the identity of each memory storage location in the plurality of memory storage locations within the CAM slice.

3. The system according to claim 2, wherein the programmable priority indicator block further comprises a plurality of identical logic blocks including a flip-flop and one of a NOR and a NAND gate, wherein use of the plurality of identical logic blocks permits programming the priority level of each memory storage location regardless of a physical location of the memory storage location within the CAM.

4. The system according to claim 1, wherein at least two CAM blocks are formed by combining respective pluralities of CAM slices.

5. The system according to claim 4, further comprising a section level priority encoder coupled to each of the at least two CAM blocks for determining a highest priority match address from inputs received by the section level priority encoder from each of the at least two CAM blocks.

6. The system according to claim 4, wherein each CAM block is programmed to have a different priority level.

7. The system according to claim 4, wherein the CAM blocks are formed of non-contiguous CAM slices.

8. The system according to claim 1, wherein each of the plurality of CAM slices is programmed to have a different priority level.

9. The system according to claim 1, wherein each of the CAM slices are formed of non-contiguous memory storage locations.

10. A device comprising:
   a CAM block having a plurality of CAM slices, wherein each of the plurality of CAM slices comprises:
      a plurality of memory storage locations for storing data to be matched with a search word, and
      an integral priority encoder for determining a highest priority match address for those storage locations of a CAM slice which match a search word, wherein the integral priority encoder is a programmable priority encoder coupled to the plurality of memory storage locations and consists of:
      an address program register;
      a slice priority encoder circuit coupled to the address program register; and
      a programmable priority indicator block coupled to the slice priority encoder circuit, wherein the address program register, the slice priority encoder circuit, and the programmable priority indicator block are encompassed within the same CAM slice and the programmable priority indicator block is used to set a priority level for each memory storage location in the plurality of memory storage locations within the CAM slice; and
   a block level priority encoder for receiving input from each of the integral priority encoders of the plurality of CAM slices for determining a highest priority match address for the storage locations within the CAM block.

11. The device according to claim 10, wherein the programmable priority encoder further comprises:
   a programmable address readout register coupled to the programmable priority indicator block, wherein the programmable address readout registers are used to set the identity of each memory storage location in the plurality of memory storage locations within the CAM slice.

12. The device according to claim 11, wherein the programmable priority indicator block further comprises a plurality of identical logic blocks including a flip-flop and one of a NOR and a NAND gate, wherein use of the plurality of identical logic blocks permits programming the priority level of each memory storage location regardless of a physical location of the memory storage location within the CAM.

13. The device according to claim 10, wherein at least two CAM blocks are formed by combining respective pluralities of CAM slices.

14. The device according to claim 13, further comprising a section level priority encoder coupled to each of the at least two CAM blocks for determining a highest priority match address from inputs received by the section level priority encoder from each of the at least two CAM blocks.

15. The device according to claim 13, wherein each CAM block is programmed to have a different priority level.

16. The device according to claim 13, wherein the CAM blocks are formed of non-contiguous CAM slices.

* * * * *